(12) United States Patent
Crowell

(10) Patent No.: US 7,254,761 B2
(45) Date of Patent: Aug. 7, 2007

(54) PLATFORM ASIC RELIABILITY

(75) Inventor: Gregory Crowell, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 66 days.

(21) Appl. No.: 11/287,927

(22) Filed: Nov. 28, 2005

(65) Prior Publication Data

US 2007/0122922 A1 May 31, 2007

(51) Int. Cl.
*G01R 31/28* (2006.01)
*G01R 31/08* (2006.01)
*G06F 17/50* (2006.01)

(52) U.S. Cl. .......................... 714/729; 716/4; 324/522
(58) Field of Classification Search .................... None
See application file for complete search history.

(56) References Cited

U.S. PATENT DOCUMENTS 6,157,210 A * 12/2000 Zaveri et al. ................. 326/40
6,897,678 B2 * 5/2005 Zaveri et al. ................. 326/39
6,990,643 B1 * 1/2006 McBride ........................ 716/5

* cited by examiner

*Primary Examiner*—Christine T. Tu
(74) *Attorney, Agent, or Firm*—Christopher P. Maiorana PC

(57) ABSTRACT

A method for monitoring a fabrication of a circuit is disclosed. The method generally includes a step of (A) fabricating a chip only up to and including a first metal layer such that (i) a core region of the chip may has an array of cells, (ii) each of the cells may have a plurality of transistors and (iii) the chip may include a plurality of flip-flops. After the fabricating of step A has started, another step may be (B) designing a plurality of upper metal layers above the first metal layer. The upper metal layers (i) may interconnect a plurality of the cells to form the circuit, (ii) may form a plurality of scan chains from a number of the flip-flops not used in the circuit and (iii) may form a plurality of paths in the upper metal layers. Each of the paths generally connects a respective output of a first of the scan chains to a respective input of a second of the scan chains. Further steps may include (C) fabricating the chip to add the upper metal layers and (D) measuring a transition delay along each of the paths to characterize the fabrication of the circuit.

20 Claims, 7 Drawing Sheets

US 7,254,761 B2

PLATFORM ASIC RELIABILITY

FIELD OF THE INVENTION

The present invention relates to fabrication reliability monitoring generally and, more particularly, to platform application specific integrated circuit (ASIC) reliability.

BACKGROUND OF THE INVENTION

Platform ASICs are designed for quick development with minimal test cost. Development and test costs make insurance that yield and reliability goals are met elusive. In particular, goals for testing defect mechanisms that result in timing delays within the circuit are difficult to achieve.

Conventional functional and conventional scan type tests at high speeds are implemented to monitor fabrication excursions that would affect chip speed. The cost of implementing high speed tests is prohibitive for a platform ASIC environment where minimal test cost is desired.

SUMMARY OF THE INVENTION

The present invention concerns a method for monitoring a fabrication of a circuit. The method generally includes a step of (A) fabricating a chip only up to and including a first metal layer such that (i) a core region of the chip may have an array of cells, (ii) each of the cells may have a plurality of transistors and (iii) the chip may include a plurality of flip-flops. After the fabricating of step A has started, another step may be (B) designing a plurality of upper metal layers above the first metal layer. The upper metal layers (i) may interconnect a plurality of the cells to form the circuit, (ii) may form a plurality of scan chains from a number of the flip-flops not used in the circuit and (iii) may form a plurality of paths in the upper metal layers. Each of the paths generally connects a respective output of a first of the scan chains to a respective input of a second of the scan chains. Further steps may include (C) fabricating the chip to add the upper metal layers and (D) measuring a transition delay along each of the paths to characterize the fabrication of the circuit.

The objects, features and advantages of the present invention include providing a method and/or architecture for platform ASIC reliability monitoring that may (i) utilize unused circuitry on a programmed slice to identify systematic fabrication defects that may result in delay type faults, (ii) have little or no impact functional circuitry, (iii) be tested with minimal cost and/or (iv) provide monitoring for yield and reliability defects with low design and reliability costs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention comprises a method that may monitor reliability and yield limiting mechanisms in metal stacks with minimal design and test costs. The method may utilize (i) unused flip-flops that would normally be paved over, (ii) optional newly created flip-flops and (iii) one or more special programmable metal delay structures. The programmable metal delay structures generally comprise a series of metal lines and vias placed between two of the flip flops. The programmable metal delay structure may be programmable in that the structure may be customized to fit into an existing circuit layout. The programmable metal delay structure may exist and operate without affecting functional elements of the circuit design. Elevated via and/or metal resistances may be measure by launching signals from originating flip-flops and capturing the signals at receiving flip-flops. One or more high speed clocks may be used for launching and capturing the signals. The signals may be generated in a transition delay type pattern. The flops may be connected in two or more scan chains. Sending scan chains generally permit the signals to be shifted onto the chip either serially or loaded in parallel from a chip input. Receiving scan chains may then serially shift results from the test to a chip output.

The chip may be implemented with an array of R-cells, a predetermined set of input/output modules and one or more optional hard macro modules. The R-cells of the chip (or slice) generally have a few thin-oxide n-channel and p-channel transistors. The R-cells may be replicated 100,000s to 1,000,000s times in a core region of the chip. The abundant R-cells may be configured to create (i) digital functions (e.g., flip-flops, scan cells, logical AND gates, logical OR gates, logical NOR gates, etc.), (ii) mixed-signal functions (e.g., both analog and digital signals) and/or (iii) analog functions.

Figure 1:
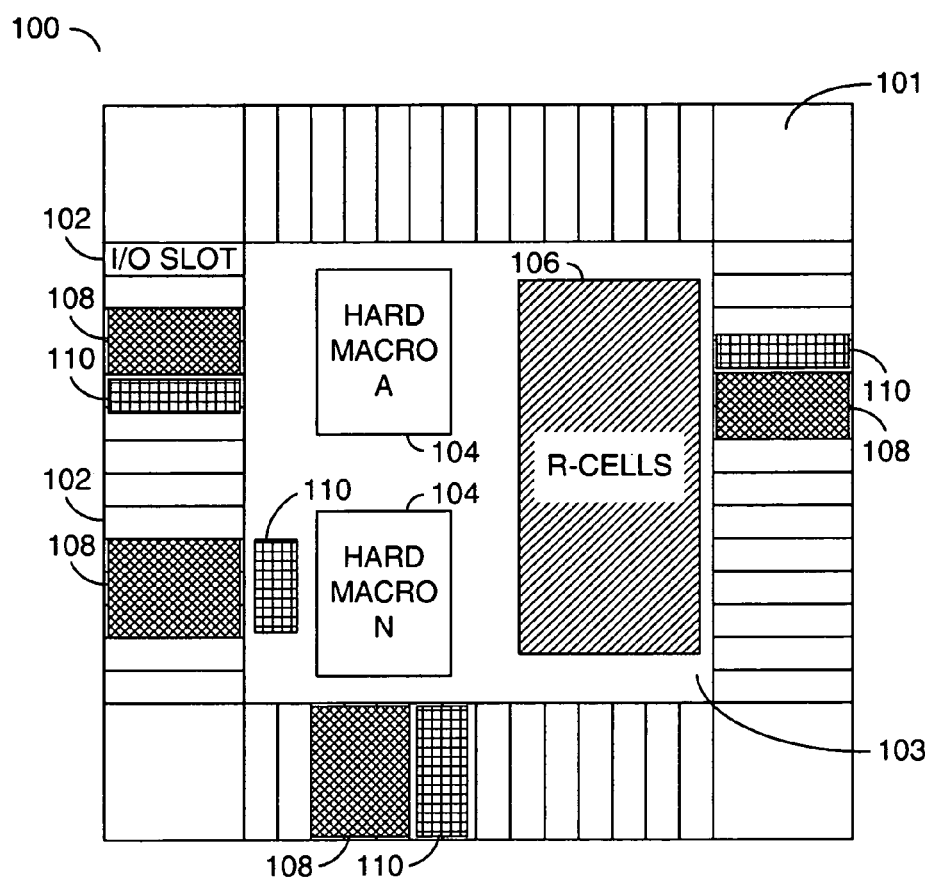
FIG. 1 is a block diagram of a programmable platform device.

Referring to FIG. 1, a block diagram of a programmable platform device (or die, or chip, or slice) 100 is shown. The slice 100 may be implemented, in one example, as a partially manufactured semiconductor device (e.g., a platform ASIC) in which all of the silicon layers (or base layers) have been fabricated (e.g., a first processing or pre-inventory phase), but where customization of the slice 100 may be performed later (e.g., a second processing or completed phase) via one or more upper metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice 100 may be selected for customization later because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, scan chain cells, etc.). The soft IP may be incorporated into a slice as a function block. The soft IP may be implemented similarly to other blocks in a design (e.g., with specific timing criteria to ensure functionality). The soft IP may be implemented, in one example, as Register Transfer Language (RTL) code. Firm IP generally allows fully routed and characterized high-performance blocks to be implemented in a slice design.

A physical layout of the slice 100 generally comprises a first region 101 and a second region 103. The first region 101 may be defined around a periphery (or outer edge) of the slice 100 where most to all of the input/output (I/O) circuits may be located. As such, the first region 101 may be referred to as an input/output region. The second region 103 may be located inside the input/output region 101. The second region 103 generally contains most or all of the standard library and custom circuitry that make the slice 100 unique. As such, the second region 103 may be referred to as a core region.

The slice 100 may comprise a number of pre-diffused regions. In one example, the slice 100 may comprise a plurality of regions 102, a number of regions 104, and one or more regions 106. The plurality of regions 102 may be located around the periphery (or outer edge) of the slice 100. The regions 102 may be implemented as configurable input/output (I/O) slots. For example, each of the regions 102 may be configured to couple the core region 103 of the slice 100 to an I/O pin. The regions 104 may be implemented as one or more hard IP blocks (or hard macros). The regions 106 may be implemented as one or more customizable regions. In one example, the customizable regions 106 may comprise an R-cell transistor fabric (or array, or matrix). In another example, the customizable regions 106 may be implemented as a gate array region. The regions 102 may be distributed around the input/output region 101 of the slice 100. The regions 104 and 106 may be distributed within the core region 103 of the slice 100.

In one example, the regions 104 may be implemented similarly to an ASIC design. In general, the regions 104 may be configured to provide a number of functions on (in) the slice 100. For example, the regions 104 may comprise phase locked loop (PLLs) blocks (or modules), instances of processor blocks (or modules), input/output physical level (PHY) macro blocks (or modules) and/or any other type of IP block (or module) appropriate to meeting the design criteria of a particular implementation. The soft IP blocks (or modules) and the firm IP blocks (or modules) may be implemented in the customizable region 106.

The customizable region 106 may be configured by a customer (e.g., by a custom design of one or more metal layers), in one example, as logic and/or memory. For example, the region 106 may be implemented as sea-of-gate arrays. In one example, the region 106 may be implemented as an R-cell transistor fabric comprising a number of R-cells. The term R-cell generally refers to an area of silicon designed (or diffused) to contain multiple transistors that have not yet been personalized (or configured) with metal layers. Wire (or trace) layers may be added for interconnecting the R-cells to make particular transistors, logic gates, soft IP blocks, firm IP blocks, mixed-signal modules and/or storage elements. For example, the R-cells in the region 106 may be customized to build non-diffused memories, flip-flops, multiplexers or other circuits for a particular application. A region 106 filled with thousands of R-cells may be referred to as an R-cell fabric region 106.

An R-cell generally comprises multiple diffusions, a gate layer and a metal layer for forming the parts of n-type and p-type transistors and the contact points where upper metal layers may be attached in subsequent manufacturing steps (e.g., to power, ground, inputs and outputs). For example, each R-cell may be implemented as a five-transistor cell, which includes two n-channel metal oxide semiconductor field effect transistors (NMOS devices), two p-channel MOSFET transistors (PMOS devices) and a small PMOS device. In general, the R-cells may be, in one example, building blocks for logic, mixed-signal and/or storage elements. The R-cells may be diffused in a regular pattern throughout a slice. For example, a way of designing a chip that performs logic and storage functions may be to lay down numerous (identical) R-cells row after row, column after column to form a matrix or array of cells. A large area of the slice 100 may be devoted to nothing but R-cells. The R-cells may be personalized (or configured) in subsequent production steps (e.g., by depositing and patterning upper metal layers) to provide particular logic functions. The logic functions may be further wired together (e.g., a gate array design).

Prior to customization, the regions 102 and 106 may comprise generic pre-diffused regions that may provide a rich set of devices (e.g., transistors, resistors, capacitors, etc.). A number of different generic pre-diffused regions may be implemented. In one example, a number of types of transistors (e.g., N and P, TO, ATO, HP, etc.) may be implemented in each of the regions 102. The R-cell fabric 106 may also be used to implement sub-functions (e.g., the circuitry 110) of the functions 108 (e.g., switched capacitor filters, gm/C filters, data converters, etc.).

The devices implemented in the slice 100 may be programmed by defining metal mask sets. In one example, metal-insulator-metal capacitors (e.g., approximately one picofarad (pF) per slot) may be formed in the regions 102 and/or 106. In one example, more than one of the regions 102 may be combined (e.g., coupled together via routing) to implement more complex functions. For example, metal mask sets may be placed over two or more of the generic pre-diffused regions 102 to form a relocatable multi-slot function 108. The relocatable multi-slot function 108 may be described as a relocatable function. The term relocatable is used as a general term to indicate that the function may be located (or configured) in a number of locations around the slice 100. While the final result would be that the function 108 would be located in different locations, different pre-diffused areas may be used to implement the function 108 in the different locations. Also, one or more of the functions 108 may be implemented throughout the plurality of regions 102 and/or 106. The functions 108 may be configured to provide analog functions, digital functions or mixed-signal functions using metal programmability.

Figure 2:
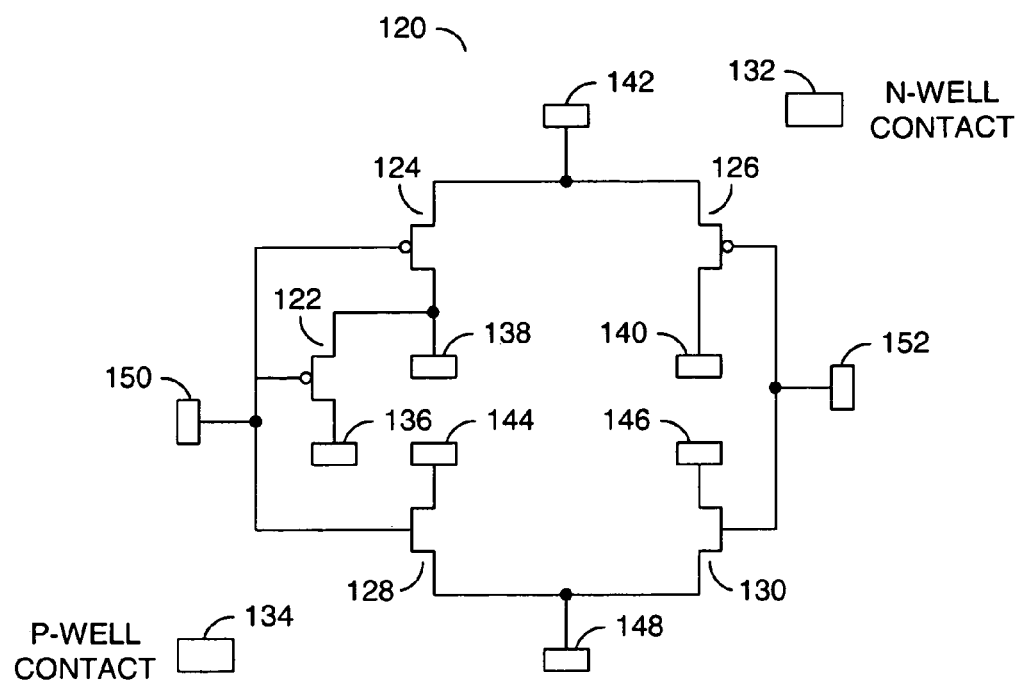
FIG. 2 is a schematic of an example implementation of an R-cell.

Referring to FIG. 2, a schematic of an example implementation of an R-cell 120 is shown. An R-cell 120 generally comprises a transistor 122, a transistor 124, a transistor 126, a transistor 128, a transistor 130, an n-well contact 132, a p-well contact 134, a transistor contact 136, a transistor contact 138, a transistor contact 140, a transistor contact 142, a transistor contact 144, a transistor contact 146, a transistor contact 148, a gate contact 150 and a gate contact 152.

The transistor 122 may be implemented as a p-channel MOSFET. A gate of the transistor 122 may be connected to the gate contact 150. A first node (e.g., source or drain) of the transistor 122 may be connected to the transistor contact 136. A second node (e.g., drain or source) of the transistor 122 may be connected to the transistor contact 138. In one embodiment, a channel width of the transistor 122 may be approximately 0.3 micrometers (um). A channel length of the transistor 122 may be approximately 0.115 um.

The transistor 124 may be implemented as a p-channel MOSFET. A gate of the transistor 124 may be connected to the gate contact 150. A first node (e.g., source or drain) of the transistor 124 may be connected to the transistor contact 138. A second node (e.g., drain or source) of the transistor 124 may be connected to the transistor contact 142. In one embodiment, a channel width of the transistor 124 may be approximately 1.59 um. A channel length of the transistor 124 may be approximately 0.115 um.

The transistor 126 may be implemented as a p-channel MOSFET. A gate of the transistor 126 may be connected to the gate contact 152. A first node (e.g., source or drain) of the transistor 126 may be connected to the transistor contact 140. A second node (e.g., drain or source) of the transistor 126 may be connected to the transistor contact 142. In one embodiment, a channel width of the transistor 126 may be approximately 1.59 um. A channel length of the transistor 126 may be approximately 0.115 um.

The transistor 128 may be implemented as an n-channel MOSFET. A gate of the transistor 128 may be connected to the gate contact 150. A first node (e.g., source or drain) of the transistor 128 may be connected to the transistor contact 144. A second node (e.g., drain or source) of the transistor 128 may be connected to the transistor contact 148. In one embodiment, a channel width of the transistor 128 may be approximately 0.88 um. A channel length of the transistor 128 may be approximately 0.115 um.

The transistor 130 may be implemented as an n-channel MOSFET. A gate of the transistor 130 may be connected to the gate contact 152. A first node (e.g., source or drain) of the transistor 130 may be connected to the transistor contact 148. A second node (e.g., drain or source) of the transistor 130 may be connected to the transistor contact 146. In one embodiment, a channel width of the transistor 130 may be approximately 1.235 um. A channel length of the transistor 130 may be approximately 0.115 um.

The R-cells 120 generally include all fabrication layers between well diffusions and a first metal layer, inclusive. When initially fabricated, each R-cell is isolated from the neighboring R-cells. Therefore, any particular R-cell may be later connected through one or more upper metal layers to other circuitry (e.g., other R-cells 120, I/O slot regions 102, hard macros 104, firm macros, soft macros, modules 108 and/or modules 110 within one power domain or crossing between two or more power domains.

Figure 3:
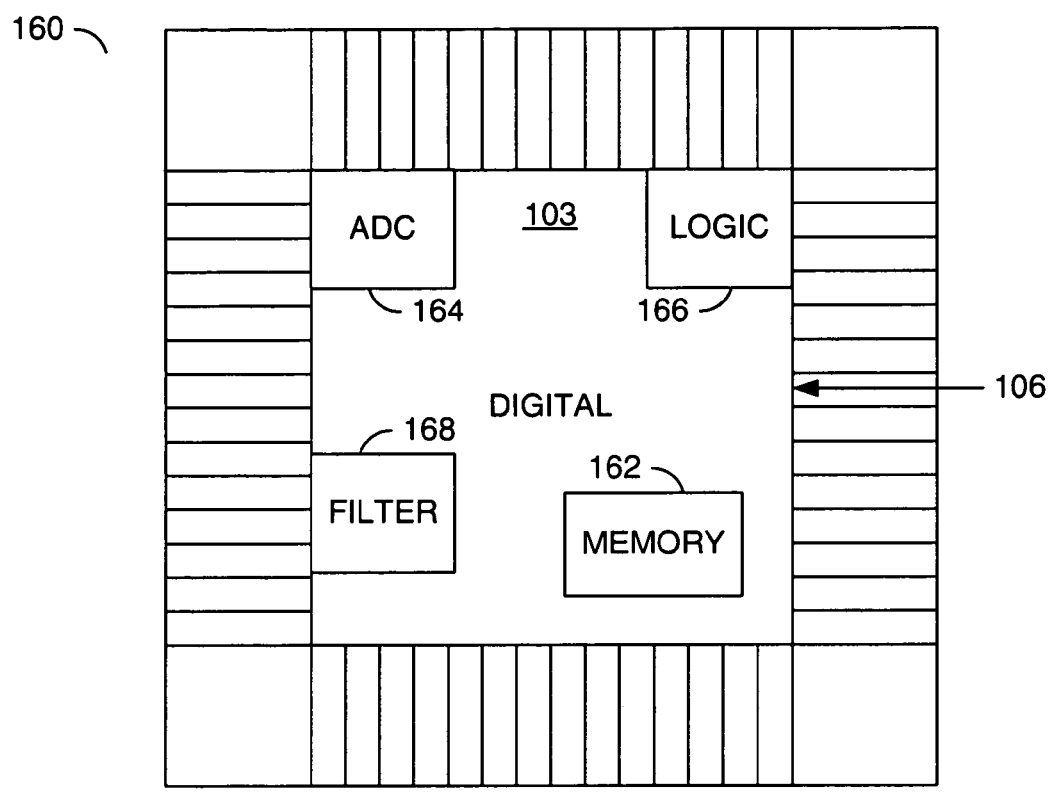
FIG. 3 is a diagram of an example layout of a slice.

Referring to FIG. 3, a diagram of an example layout of a slice 160 is shown. The slice 160 generally includes a digital module 162 (e.g., memory), a mixed-signal module 164 (e.g., an analog-to-digital converter (ADC)), a logic module 166 (e.g., a number of basic logic blocks) and an analog module 168 (e.g., filter) within the core region 103. In the example layout, the digital memory module 162 may be implemented using predetermined diffusions, oxides, vias and first metal layer patterns specific to the memory module and thus the memory module 162 may have a fixed location in the core region 103. The ADC module 164, the logic module 166 and the filter module 168 are generally implemented using predetermined diffusions, oxides, polysilicon, vias and first metal layer patterns specific to the respective modules. Design of the modules 162-168 may include specific transistors, resistors, capacitors, amplifiers, and the like. As such, the ADC module 164, the logic module 166 and the filter module 168 may have a fixed location in the core region 103 for the particular slice 160. The remaining area of the core region 103 not occupied by the memory module 162, the ADC module 164, the logic module 166 and the filter module 168. The remaining area (e.g., customizable region 106) may be filled with R-cells to enable customization of the slice 160.

Consider a customer building a circuit based on the slice 160, having the modules 162-168. Each of the predefined modules 162-168 (previously fabricated as part of the slice 160) are generally available for use in the customer's circuit design. Where the design incorporates the modules 162-168, the design time is simplified and space within the core region 103 may be efficiently utilized. An unused module 162-168 may remain unconnected to any other circuits in the final design and thus generally does not consume any power. However, flip-flops, multiplexers and scan chain cells unused in the logic module 166 may be used to generate a test circuit (or module) for measuring propagation delays in the completed chip to evaluate the fabrication process.

Figure 4:
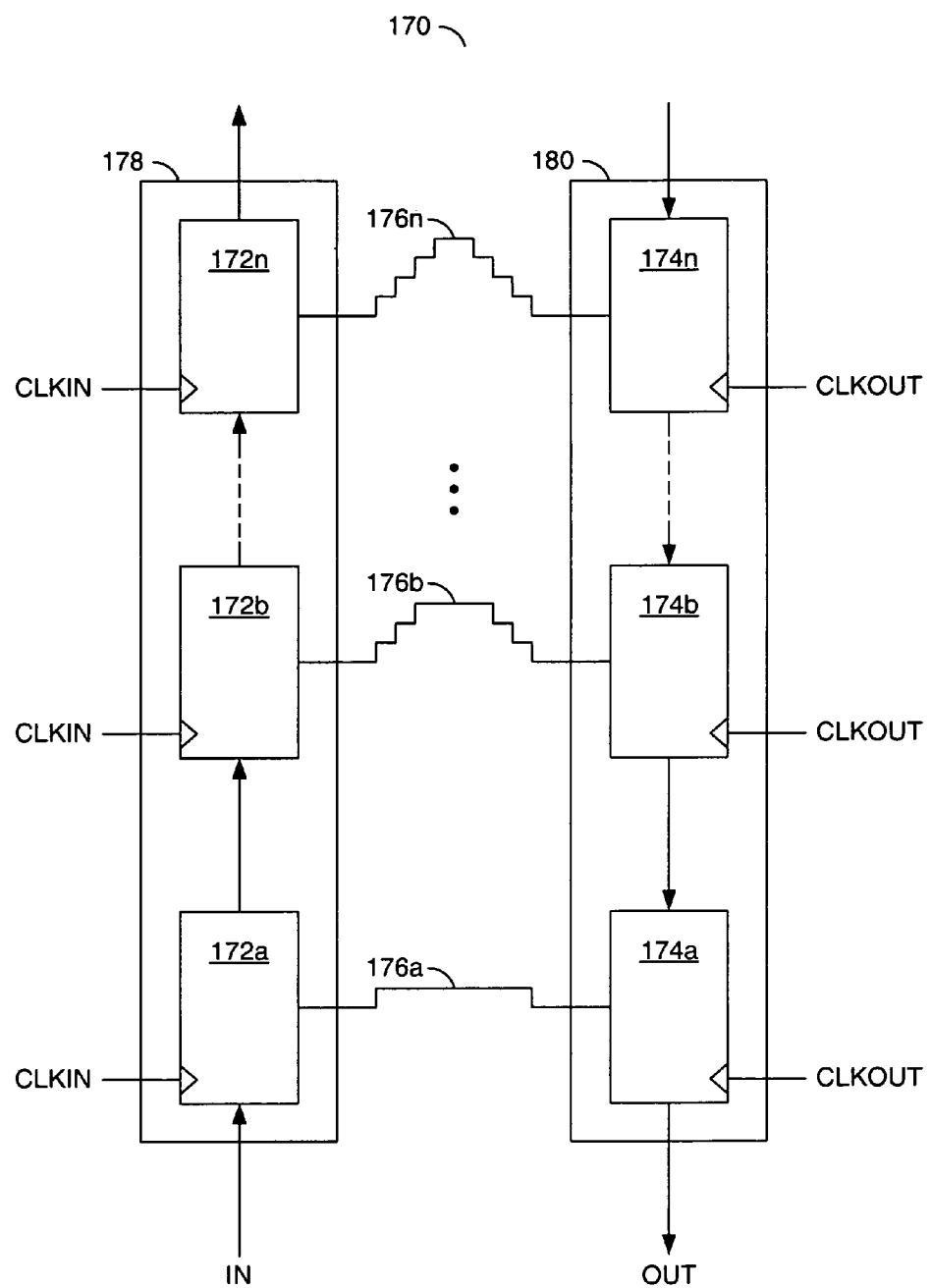
FIG. 4 is a block diagram of an example test circuit is shown in accordance with a preferred embodiment of the present invention.

Referring to FIG. 4, a block diagram of an example test circuit 170 is shown in accordance with a preferred embodiment of the present invention. The test circuit 170 generally comprises a number of circuits 172a-172n, a number of circuits 174a-174n and a number of circuits 176a-176n. An input signal (e.g., IN) may be received by the circuit 172a. An output signal (e.g., OUT) may be generated by the circuit 174a. The test circuit 170 may be created in the input/output region 101 and/or the core region 103. The circuits 172a-172n and the circuit 174a-174n may be formed from unused circuitry in the logic module 166, unused circuitry in the I/O slot regions 102, the R-cell fabric region 106 and/or other unused circuitry.

Each of the circuits 172a-172n and the circuits 174a-174n may be referred to as a scan cell. The scan cells 172a-172n may be arranged to form a scan chain 178 (although not necessarily a boundary scan chain). The scan chain 178 may be referred to as a sending scan chain. In some embodiments, the sending scan chain 178 may be operational to perform a broadside type of transition delay test. In other embodiments, the sending scan chain 178 may be operational to perform a launch-off-shift type of transition delay test. The broadside type test generally involves the sending scan chain 178 to generate a transition on each of the circuits 176a-176n substantially simultaneously on a single edge of a clock signal (e.g., CLKIN). The launch-off-shift type test generally involves the sending scan chain 178 to generate a transition on a single circuit 176a-176n on each successive rising or falling edge of the clock signal CLKIN.

The scan chain cells 174a-174n may be arranged to form a scan chain 180 (although not necessarily a boundary scan chain). The scan chain 180 may be referred to as a receiving scan chain. The receiving scan chain 180 may be operational to perform the broadside type of transition delay test or the launch-off-shift type of transition delay test to match the sending scan chain 178.

Each of the circuits 176a-176n may be referred to as a programmable metal delay structure or a path. Each of the paths 176a-176n generally comprises multiple metal traces (or wires) and multiple vias. Each of the traces may be formed on one or more of the upper metal layers. The vias may connect traces on adjacent metal layers.

Figure 5:
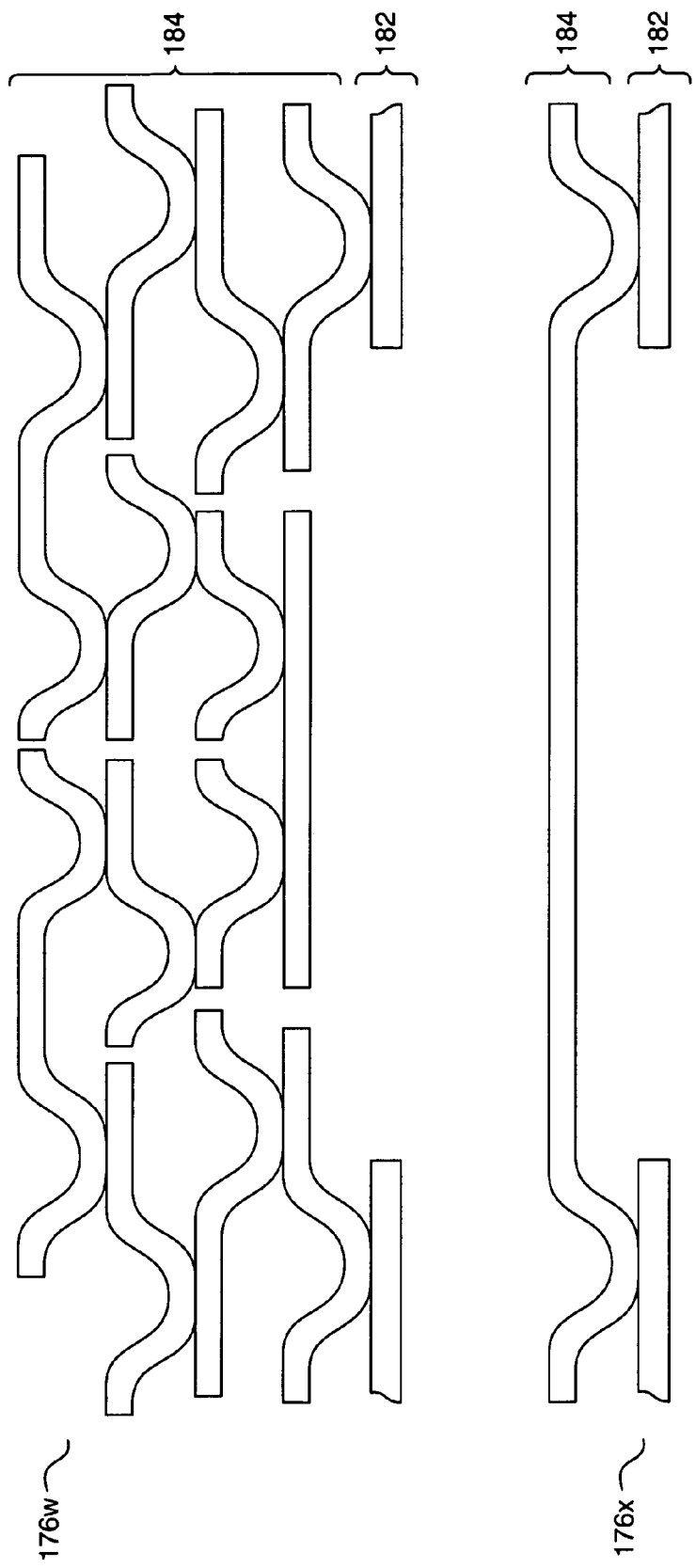
FIG. 5 is a perspective view of example paths.

Referring to FIG. 5, a perspective view of example paths 176w and 176x is shown. The paths 176w and 176x may be illustrative of any one or more of the paths 176a-176n. Each of the paths 176w-176x may have a total path resistance and a total path length. Each total path resistance may be determined by a number of via resistances and a number of trace resistances in the respective path 176w-176x. Each total path length may be determined by a sum of the individual path segments that make up the respective path 176w-176x. The paths 176w-176x are generally formed, in part, in a first metal layer 182 that is fabricated as part of the slice 100. Furthermore, the paths 176w-176x may also be formed, in part, in one or more upper metal layers 184. The upper metal layers 184 may be used to covert a generic slice 100 into a customer-defined ASIC circuit.

The path 176w generally illustrates a multi-metal layer path having the total resistance dominated by a via (or contact) resistance. In particular, the path 176w may transition a large number of times between the metal layers while traversing only a short distance on any given metal layer.

The path 176x generally illustrates a minimum metal layer path having the total resistance dominated by the trace resistance. In particular, the path 176x may have a minimum number of vias (e.g., two) while traversing a long distance in one or a few metal layers 184. The path 176x may be fabricated using the first metal layer 182 and only one or a few metal layers among the upper metal layers 184.

Each of the paths 176a-176n may have a similar physical length. As such, a propagation delay along each path 176a-176n may be similar. Each of the paths 176a-176n may have a unique physical length. Therefore, the propagation delay along each path 176a-176n may be programmed to span a range of intended delays. Each of the paths 176a-176n may be fabricated across the same (e.g., all) number of the upper metal layers 184. Covering all of the upper metal layers 184 may be useful in providing a statistically large sample of trace resistances and via resistances. Each of the paths 176a-176n may be fabricated mainly on a unique upper metal layer 184. Separating the paths 176a-176n onto individual metal layers generally allows testing of the individual metal layer fabrication parameters.

Returning to FIG. 4, operation of the test circuit 170 generally comprises generating signals from each output the sending scan chain 178 and sampling for the signals a predetermined time later at each input of the receiving scan chain 180. For a broadside type test, the sending scan chain 178 and the receiving scan chain 180 may be initialized with all logical zeros (or all logical ones). Test signals each comprising a logical one (or a logical zero) may be loaded into the sending scan chain 178 either serially or in parallel. One a single edge of the signal CLKIN (e.g., a rising edge), each of the scan chain cells 172a-172n may generate a logical zero to logical one (or a logical one to a logical zero) transition on a respective path 176a-176n. The scan cells 174a-174n in the receiving scan chain 180 may be either (i) clocked all in parallel to sample the voltages on the respective paths 176a-176n or (ii) clocked sequentially in rapid order (e.g., faster than a clock cycle of the clock signal CLKOUT) to capture the signals on the paths 176a-176n at slightly different time. The values captured by the receiving scan chain 180 may then be transferred external to the slice 100 in the signal OUT for further analysis.

A launch-off-shift type test may be performed by initializing the sending scan chain 178 and the receiving scan chain 180 to all logical zeros (or all logical ones). A test signal having a logical one value (or a logical zero value) may be serially shifted into the first scan cell 172a upon an initial clock edge (e.g., a rising clock edge) of the signal CLKIN. On each successive clock edge of the signal CLKIN, the logical one value (or logical zero value) may be shifted to a next scan cell 172b-172n and presented on a respective path 176a-176n. At the receiving end, a particular scan cell 174a-174n may be placed in a parallel input mode while the remaining scan cells 174a-174n may be placed in a serial input mode. At a predetermined delay after the initial clock edge of the signal CLKIN, a clock signal (e.g., CLKOUT) may trigger the particular scan cell 174a-174n (in the parallel input mode) to capture the voltage on the respective path 176a-176n. At subsequent clock edges of the signal CLKOUT, the value captured by the particular scan cell 174a-174n may be serially transferred through the receiving scan chain 180 and finally presented in the signal OUT for analysis. The particular scan cell 174a-174n may also be placed back in the serial input mode and a next scan cell 174a-174n may be placed in the parallel input mode to capture on the next clock edge, and so on.

Analysis of the values in the signal OUT may provide a general indication of the fabrication quality for the upper metal layers 184. In turn, the fabrication quality for the upper metal layers 184 may provide a general indication for the reliability of the circuit created in (on) the slice 100.

Operation of the test circuit 170 may be independent of all operational modes of a customer-defined circuit (e.g., blocks 102, 104, 106, 108 and 110) created with the slice 100. For example, the scan chains 178 and 180 may be created independently of a boundary scan chain used to test the customer circuit. As such, the test circuit 170 may have no impact on the operation of the customer-defined circuit.

To conserve circuitry, the test circuit 170 may be implemented as part of a boundary scan chain for the customer-defined circuit. Therefore, the test circuit 170 may be operated only while the customer-defined circuit is in a test mode. In the test mode, the sending scan chain 178, the receiving scan chain 180 and the rest of the boundary scan chain may be used to exercise the paths 176a-176n. As such, the normal inputs and output of the customer-defined circuit may be prohibited from operating through the normal bonding pads.

Figure 6:
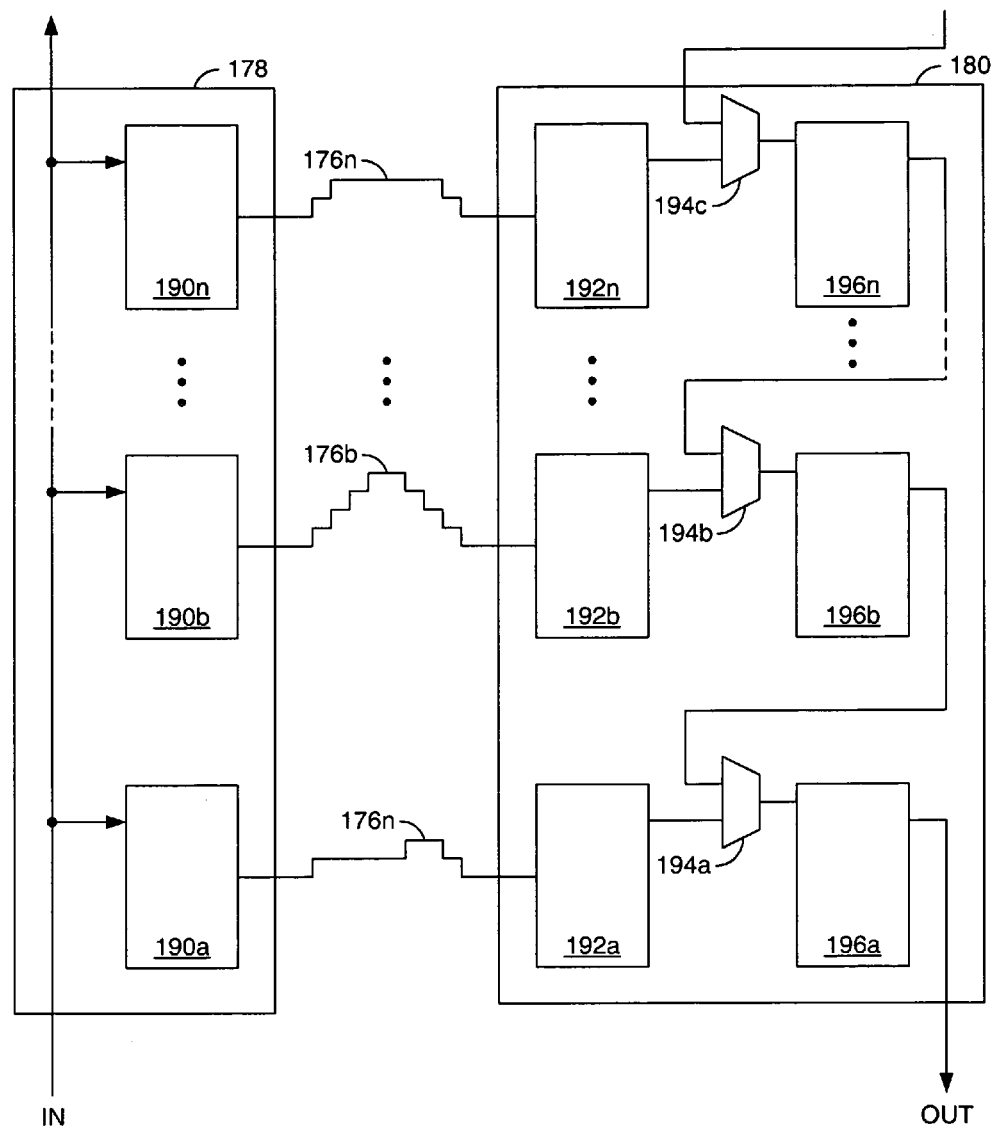
FIG. 6 is a block diagram of example implementations of a sending scan chain and a receiving scan chain.

Referring to FIG. 6, a block diagram of example implementations of the sending scan chain 178 and the receiving scan chain 180 are shown. The sending scan chain 178 generally comprises a number of flip-flops 190a-190n. The receiving scan chain 180 generally comprises a number of input flip-flops 192a-192n, a number of multiplexers 194a-194n and a number of output flip-flops 196a-196n.

The flip-flops 190a-190n may be arranged to perform a parallel load of the signal IN. Without a serial loading capability, the flip-flops 190a-190n may be simpler to create compared with the scan cells 172a-172n.

Each of the flip-flops 192a-192n may be arranged to capture the signal on a respective path 176a-176n. The flip-flops 192a-192n may be designed to operate in parallel or individually, depending on the types of tests planned. The flip-flops 196a-196n may be arranged to perform a serial shift to generate the signal OUT. The multiplexers 194a-194n may be operational to select either the data stored in a respective flip-flop 192a-192n or the data stored in a previous flip-flop 196a-196n during the serial transfer to the signal OUT.

Figure 7:
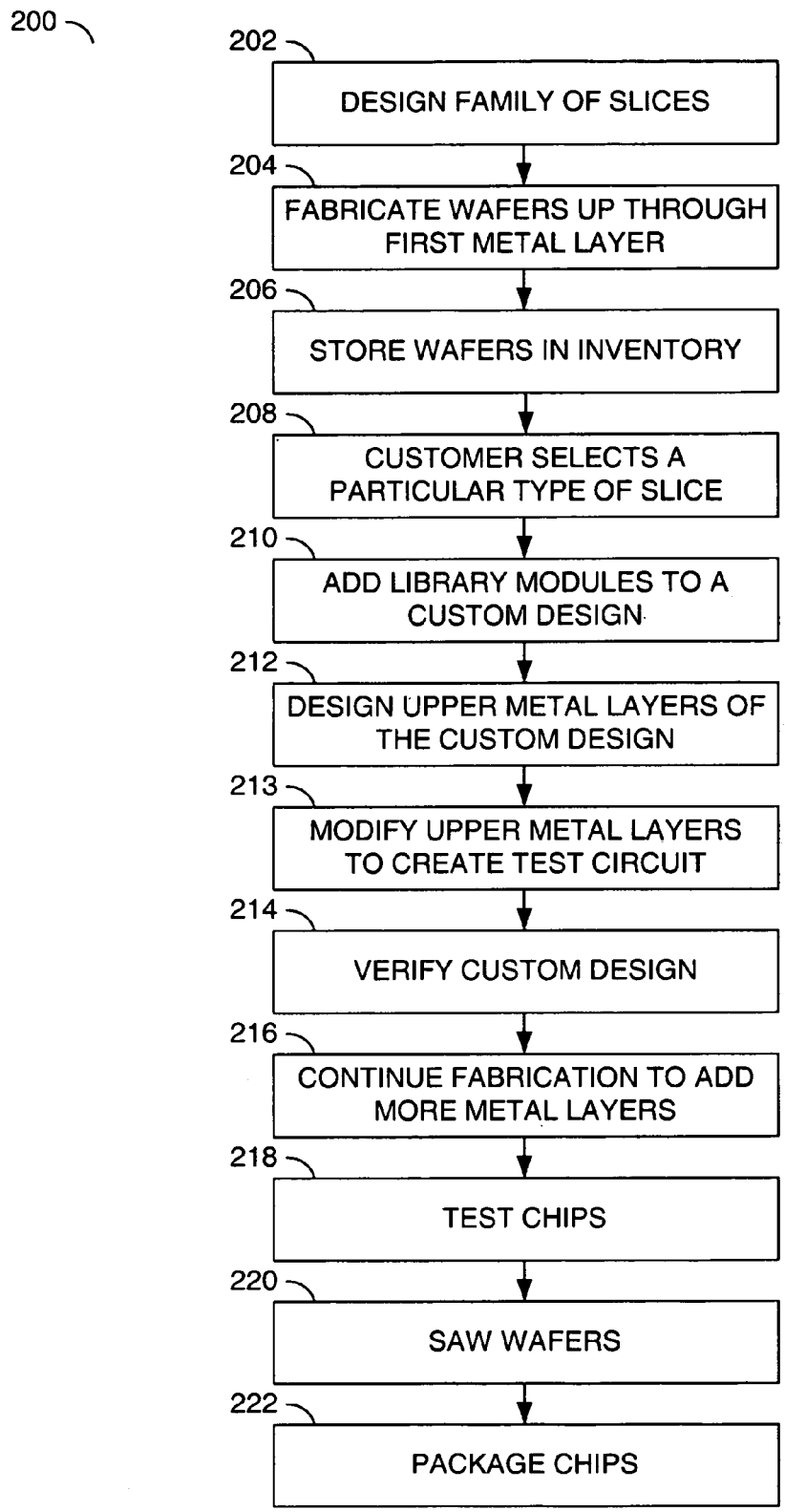
FIG. 7 is a flow diagram of an example method for designing and providing a chip.

Referring to FIG. 7, a flow diagram of an example method 200 for designing and providing a chip is shown. The method 200 generally comprises a step (or block) 202, a step (or block) 204, a step (or block) 206, a step (or block) 208, a step (or block) 210, a step (or block) 212, a step (or block) 213, a step (or block) 214, a step (or block) 216, a step (or block) 218, a step (or block) 220 and a step (or block) 222.

The method (or process) 200 may start with the design of a family of slices (e.g., including slice 100) in step 202. Each different slice design in the family may include a different assortment of fixed memory blocks (e.g., memory block 162), memory physical interface blocks, communication blocks, clock generation blocks, customizable input/output blocks, fixed design input/output blocks and/or processor blocks. An initial fabrication may be performed in step 204 to create wafers in each of the families. The wafers may then be placed in storage in step 206 until needed to fill a customer order. Storage may last from days to months, or even longer.

After the wafers have been fabricated, or while the wafers are being fabricated, a customer may begin developing a custom design by selecting one of the members from the slice family as a starting point in step 208. Using the circuitry provided by the selected slice member, the customer may add standard library blocks to the selected slice to increase the functionality in step 210. The standard library blocks may be hard IP, firm IP and/or soft IP that utilize the R-cells 120 and any other undefined elements in the slice to implement a standard function (e.g., processor, PLL, memory, etc.) One or more variations of analog modules (e.g., filter module 178), mixed-signal modules (e.g., ADC module 174) and digital modules (e.g., memory module 172) may be available in the library as a relocatable block. The modules may be positioned in the core region 103 as appropriate.

The customer may continue the development by designing interconnecting traces (or wires) for signals and power in one or more metal (or conductive) layers, starting from the second metal layer and up, in step 212. The design of the upper metal layers may provide connections among the predefined circuitry in the particular slice and the standard library cells added to the slice. The design of the upper metal layers may also be used to create custom circuitry using the R-cells 120. For example, a function unavailable in the library of standard blocks may be synthesized using the transistors in the R-cells 120.

After the custom design has been completed, the layout of the upper metal layers may be modified in the step 213 to form a test circuit (e.g., the test circuit 170). The modification may involve connecting unused flip-flops (e.g., in the logic module 166, input/output region 102, etc.) not used by the customer's circuit. The modification may include formation of new flip-flops in the R-cell region 106 where insufficient numbers of unused flip-flops are available.

After the metal layer layouts have been completed, a verification may be performed in step 214. A variety of commercial tools are generally available to perform verification checks. Any problems identified by the verification may be corrected in the design by returning to the step 212.

Once the verification has been completed, wafers of the selected slice type may be removed from the inventory for additional processing. In step 216, additional metal layers, insulating layers, top coats and the like may be fabricated on the wafers. Limited functional testing of each chip may then be performed in step 218. The testing generally includes exercising the test circuit 170 to characterize the just-completed fabrication process. Test results may provide (i) an indication of a reliability of the platform ASIC devices and (ii) feedback to the foundry for quality control purposes.

After testing, the wafers are generally sawed in step 220 to separate the individual chips. Good chips may be packaged in step 222 to create a finished product. The packaged chips may be provided to the customer for additional testing and evaluation.

The function performed by the flow diagram of FIG. 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMS, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for monitoring a fabrication of a circuit, comprising the steps of:
   (A) fabricating a chip only up to and including a first metal layer such that (i) a core region of said chip has an array of cells, (ii) each of said cells having a plurality of transistors and (iii) said chip includes a plurality of flip-flops;
   (B) after said fabricating of step (A) has started, designing a plurality of upper metal layers above said first metal layer, said upper metal layers (i) interconnecting a plurality of said cells to form said circuit, (ii) forming a plurality of scan chains from a number of said flip-flops not used in said circuit and (iii) forming a plurality of paths in said upper metal layers, wherein each of said paths connects a respective output of a first of said scan chains to a respective input of a second of said scan chains;
   (C) fabricating said chip to add said upper metal layers; and
   (D) measuring a transition delay along each of said paths to characterize said fabrication of said circuit.

2. The method according to claim 1, wherein said scan chains are configured to measure said transition delays on all of said paths substantially simultaneously.

3. The method according to claim 1, wherein said scan chains are configured to measure said transition delays sequentially on said paths, one of said transition delays on one of said paths at a time.

4. The method according to claim 1, wherein at least one of said transition delays is dominated by a metal trace resistance in a respective one of said paths.

5. The method according to claim 1, wherein at least one of said transition delays is dominated by a plurality of via resistances in a respective one of said paths.

6. The method according to claim 1, wherein each of said paths is routed primarily along a respective one of said upper metal layers.

7. The method according to claim 1, wherein each of said paths has a unique physical distance.

8. A method for monitoring a fabrication of a circuit, comprising the steps of:
(A) fabricating a chip only up to and including a first metal layer such that (i) a core region of said chip has an array of cells and (ii) each of said cells having a plurality of transistors;
(B) after said fabricating of step (A) has started, designing a plurality of upper metal layers above said first metal layer, said upper metal layers (i) interconnecting a plurality of said cells to form said circuit, (ii) forming a plurality of scan chains and (iii) forming a plurality of paths in said upper metal layers, wherein (iv) each of said paths connects a respective output of a first of said scan chains to a respective input of a second of said scan chains and (v) said circuit operates in a normal mode independently from all of said scan chains and said paths;
(C) fabricating said chip to add said upper metal layers; and
(D) measuring a transition delay along each of said paths to characterize said fabrication of said circuit.

9. The method according to claim 8, wherein said scan chains are configured to measure said transition delays on all of said paths substantially simultaneously.

10. The method according to claim 8, wherein said scan chains are configured to measure said transition delays sequentially on said paths, one of said transition delays on one of said paths at a time.

11. The method according to claim 8, wherein step (B) comprises the sub-step of:
interconnecting a plurality of said cells to form at least one flip-flop in at least one of said scan chains.

12. The method according to claim 8, wherein step (B) comprises the sub-step of:
interconnecting a plurality of flip-flops (i) formed in said fabrication of step (A) and (ii) not used by said circuit to form said scan chains to create said scan chains.

13. The method according to claim 8, wherein each of said paths comprise at least two via contacts.

14. The method according to claim 8, wherein step (B) comprises the sub-step of:
designing said upper metal layers such that said circuit operates in all modes independently from all of said scan chains and said paths.

15. A method for monitoring a fabrication of a circuit, comprising the steps of:
(A) fabricating a chip only up to and including a first metal layer such that (i) a core region of said chip has an array of cells and (ii) each of said cells having a plurality of transistors;
(B) after said fabricating of step (A) has started, designing a plurality of upper metal layers above said first metal layer, said upper metal layers (i) interconnecting a plurality of said cells to form said circuit, (ii) forming a plurality of scan chains and (iii) forming a plurality of paths in said upper metal layers, wherein (iv) each of said paths connects a respective output of a first of said scan chains to a respective input of a second of said scan chains and (v) said circuit operates in all modes independently from all of said scan chains and said paths;
(C) fabricating said chip to add said upper metal layers; and
(D) measuring a transition delay along each of said paths to characterize said fabrication of said circuit.

16. The method according to claim 15, wherein said scan chains are configured to measure said transition delays on all of said paths substantially simultaneously.

17. The method according to claim 15, wherein said scan chains are configured to measure said transition delays sequentially on said paths, one of said transition delays on one of said paths at a time.

18. The method according to claim 15, wherein step (A) comprises the sub-step of:
designing said first scan chain to implement both (i) a parallel load from a single input and (ii) a parallel output to all of said paths.

19. The method according to claim 15, wherein each of said paths has an approximately same physical length.

20. The method according to claim 15, wherein step (B) further comprises the sub-step of:
designing said upper metal layers to (i) interconnect a plurality of said cells to form a plurality of flip-flops and (ii) interconnect said flip-flops to form said scan chains.

* * * * *